United States Patent
Van Der Pasch et al.

(10) Patent No.: US 7,408,617 B2
(45) Date of Patent: Aug. 5, 2008

(54) LITHOGRAPHIC APPARATUS AND DEVICE MANUFACTURING METHOD UTILIZING A LARGE AREA FPD CHUCK EQUIPPED WITH ENCODERS AN ENCODER SCALE CALIBRATION METHOD

(75) Inventors: Engelbertus Antonius Fransiscus Van Der Pasch, Oirschot (NL); Harmen Klaas Van Der Schoot, Vught (NL)

(73) Assignee: ASML Netherlands B.V., Veldhoven (NL)

( * ) Notice: Subject to any disclaimer, the term of this patent is extended or adjusted under 35 U.S.C. 154(b) by 398 days.

(21) Appl. No.: 11/165,575

(22) Filed: Jun. 24, 2005

(65) Prior Publication Data

US 2006/0290914 A1 Dec. 28, 2006

(51) Int. Cl.
*G03B 27/42* (2006.01)

(52) U.S. Cl. .............................. 355/53; 355/72; 378/34

(58) Field of Classification Search ................... 355/53, 355/72, 75, 77; 378/34, 35; 250/492.2
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,751,403 A * | 5/1998 | Mizutani et al. | 355/53 |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,559,924 B2 * | 5/2003 | Ina et al. | 355/53 |
| 6,687,041 B1 | 2/2004 | Sandstrom | |
| 6,747,783 B1 | 6/2004 | Sandstrom | |

(Continued)

FOREIGN PATENT DOCUMENTS

EP 1182509 * 2/2002

(Continued)

*Primary Examiner*—Della J. Rutledge
(74) *Attorney, Agent, or Firm*—Sterne, Kessler, Goldstein & Fox P.L.L.C.

(57) ABSTRACT

A lithographic apparatus comprises an illumination system, an array of individually controllable elements, a substrate table, a projection system, a position encoder, an imaging device, and an image processing unit. The illumination system conditions a radiation beam. The array of individually controllable elements modulates the cross-section of the radiation beam. The substrate table supports a substrate. The projection system projects the modulated radiation beam onto a target portion of the substrate, thereby applying a pattern to the target portion of the substrate. The pattern comprises a first line and a second line. The first line is offset from the second line. The position encoder determines a position of the substrate table. The position encoder comprises a position sensor and a scale. The scale comprises a plurality of lines intended to be straight and parallel to one another. The imaging device obtains an image of the first line and the second line. The image processing unit measures the separation between the first line and the second line in a plurality of locations, and determines the non-uniformity of at least a part of the scale from the plurality of separations.

28 Claims, 10 Drawing Sheets

U.S. PATENT DOCUMENTS

| | | |
|---|---|---|
| 6,795,169 B2 | 9/2004 | Tanaka et al. |
| 6,806,897 B2 | 10/2004 | Kataoka et al. |
| 6,811,953 B2 | 11/2004 | Hatada et al. |
| 7,256,871 B2 * | 8/2007 | Loopstra et al. ............... 355/72 |
| 2004/0041104 A1 | 3/2004 | Liebregts et al. |
| 2004/0130561 A1 | 7/2004 | Jain |
| 2005/0007572 A1 | 1/2005 | George et al. |
| 2006/0139660 A1 * | 6/2006 | Patrick Kwan .............. 356/614 |

FOREIGN PATENT DOCUMENTS

| | | | |
|---|---|---|---|
| EP | 1400855 | * | 3/2004 |
| WO | WO 98/33096 | | 7/1998 |
| WO | WO 98/38597 | | 9/1998 |

* cited by examiner

US 7,408,617 B2

LITHOGRAPHIC APPARATUS AND DEVICE MANUFACTURING METHOD UTILIZING A LARGE AREA FPD CHUCK EQUIPPED WITH ENCODERS AN ENCODER SCALE CALIBRATION METHOD

BACKGROUND

1. Field

The present invention relates to a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred on (part of) the substrate (e.g., a glass plate) via imaging onto a layer of radiation-sensitive material (resist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate can be rectangular in shape. Lithographic apparatus designed to expose a substrate of this type can provide an exposure region that covers a full width of the rectangular substrate, or which covers a portion of the width (for example half of the width). The substrate can be scanned underneath the exposure region, while the mask or reticle is synchronously scanned through the projection beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

In a conventional lithographic apparatus, the location of a substrate table (and hence the substrate which it supports) is measured with the aid of interferometers. Interferometers use a change in path length or phase of light reflected from a target to determine a change in distance.

It is known that the accuracy of results from an interferometer depend highly on the path the light takes. For example, it is necessary to take account of fluctuations in the air through which the light travels. These fluctuations include changes in temperature and pressure (or density) of the air. When the light used by the interferometer to measure changes in distance has to travel over a distance of, for example, about 300 mm, these fluctuations are easily minimized without compromising measurement accuracy, and even negligible in some circumstances. However, as the distance, or path length increases, and the error tolerance in substrate position decreases it becomes increasingly necessary, and correspondingly difficult, to accurately minimize these fluctuations.

There is currently a high consumer demand for larger flat panel displays, and this demand is predicted to continue and even increase in the coming years. The larger the flat panel display, the larger the substrate constituting that display needs to be. However, an increase in substrate size has associated disadvantages that need to be addressed.

Depending on how the lithographic apparatus applies the desired pattern onto the substrate, an increase in substrate size causes a corresponding increase in the path length of light used by the interferometer. The size of flat panel substrates has increased to such an extent that, for particular lithographic apparatus, the path length of light used by the interferometer can be of the order of about 6 meters (i.e., the distance from the interferometer to the point from which light is reflected (the beam length) can be of the order of 3 meters. The path length is defined as being twice the beam length). For such large path lengths, it is difficult to minimize the above-mentioned fluctuations, and consequently it is difficult or impossible to accurately position a substrate.

Therefore, what is needed is a system and method that can accurately determine location of and position a substrate regardless of a size of the substrate.

SUMMARY

According to one embodiment of the invention, there is provided a lithographic apparatus comprising an illumination system, an array of individually controllable elements, a substrate table, a projection system, a position encoder, an imaging device, and an image processing unit. The illumination system conditions a radiation beam. The array of individually controllable elements modulates the cross-section of the radiation beam. The substrate table supports a substrate. The projection system projects the modulated radiation beam onto a target portion of the substrate, thereby applying a pattern to the target portion of the substrate. The pattern comprises a first line and a second line. The first line is offset from the second line. The position encoder determines a position of the substrate table. The position encoder comprises a position sensor and a scale. The scale comprises a plurality of lines intended to be straight and parallel to one another. The imaging device obtains an image of the first line and the second line. The image processing unit measures the separation between the first line and the second line in a plurality of locations, and determines the non-uniformity of at least a part of the scale from the plurality of separations.

According to one embodiment of the invention, there is provided a lithographic apparatus comprising an illumination system, an array of individually controllable elements, a substrate table, a projection system, a position encoder, an imaging device, and an image processing unit. The illumination system conditions a radiation beam. The array of individually controllable elements modulates the cross-section of the radiation beam. The substrate table supports a substrate. The projection system projects the modulated radiation beam onto a target portion of the substrate. The position encoder determines a position of the substrate table, the position encoder comprising a position sensor and a scale. The scale comprises a plurality of lines intended to be equally spaced. The imaging device obtains an image of at least a part of a pattern exposed on the substrate. The image processing unit is arranged to compare the exposed pattern with at least a part of a corresponding intended pattern, and to determine the non-uniformity of at least a part of the scale from the comparison.

In one embodiment of the present invention, there is provided a method of determining a non-uniformity of lithographic apparatus comprising the following steps. Projecting a modulated radiation beam onto a target portion of a substrate. Applying a pattern to the target portion of the substrate. The pattern comprises a first line and a second line, the first line being offset from the second line. Using an imaging device to obtain an image of the first line and the second line. Measuring the separation between the first line and the second line in a plurality of locations. Determining the non-uniformity of at least a part of the scale from the plurality of separations.

In one embodiment of the present invention there is provided a method of determining a non-uniformity of lithographic apparatus comprising the following steps. Projecting the modulated radiation beam onto a target portion of the substrate. Applying a pattern to the target portion of the substrate. Using an imaging device to obtain an image of at least part of the pattern. Comparing the pattern with a corresponding intended pattern. Determining the non-uniformity of at least a part of the scale from the comparison.

In one embodiment of the present invention, there is provided a lithographic apparatus comprising an illumination system, an array of individually controllable elements, a substrate table, a projection system, a positioner, and a position encoder. The illumination system conditions a radiation beam. The array of individually controllable elements modulates a cross-section of the radiation beam. The substrate table supports a substrate. The projection system projects the modulated radiation beam onto a target portion of the substrate. The positioner positions the substrate table. The position encoder determines a position of the substrate table.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
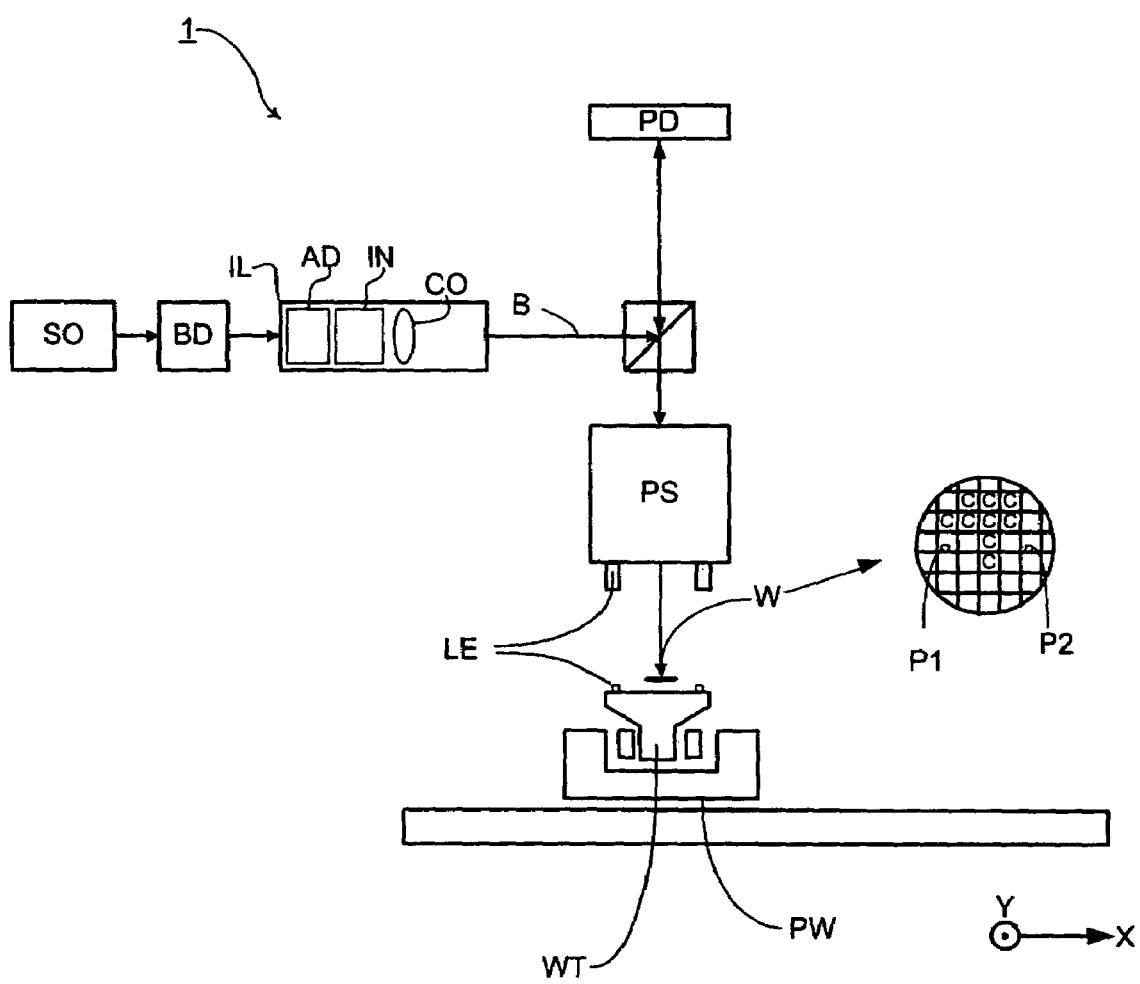
FIGS. 1 and 2 depict lithographic apparatus, according to various embodiments of the present invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 schematically depicts a lithographic apparatus according to one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the projection beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 μm, e.g., at least 100 μm, at least 200 μm, at least 300 μm, at least 400 μm, at least 500 μm, or at least 600 μm. In one example, the thickness of the substrate is at most 5000 μm, e.g., at most 3500 μm, at most 2500 μm, at most 1750 μm, at most 1250 μm, at most 1000 μm, at most 800 μm, at most 600 μm, at most 500 μm, at most 400 μm, or at most 300 μm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 2:
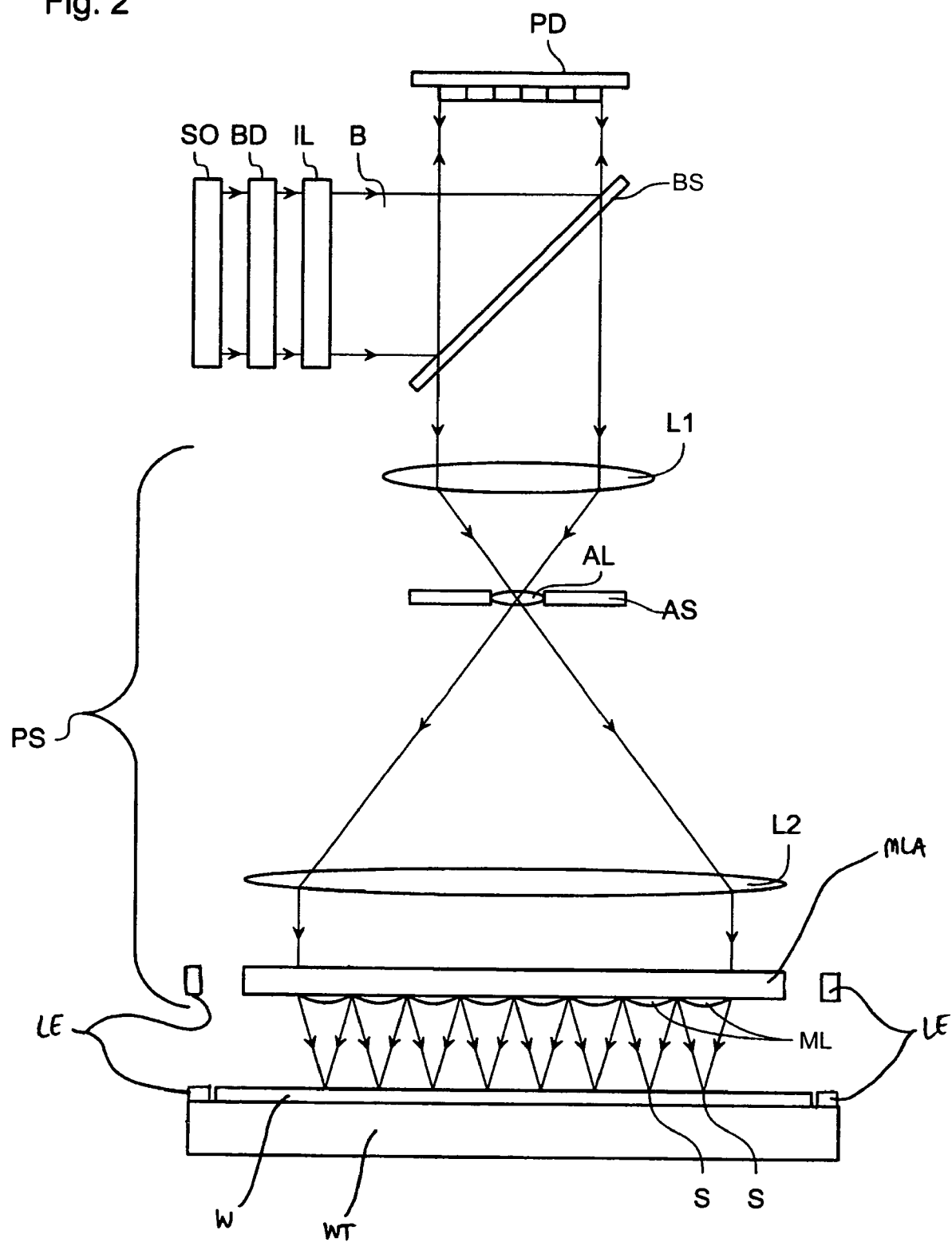

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and linear encoders LE, the substrate table WT can be moved accurately, e.g., so as to position different target portions C in the path of the radiation beam B. The linear encoders LE is described in more detail further below Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the projection beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the projection beam B is caused to scan a line across the substrate W. The pattern on the array of individually controllable elements is updated as required between pulses of the radiation system and the pulses are timed such that successive target portions C are exposed at the required locations on the substrate W. Consequently, the projection beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the projection beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary not only to maximum or minimum intensity levels but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
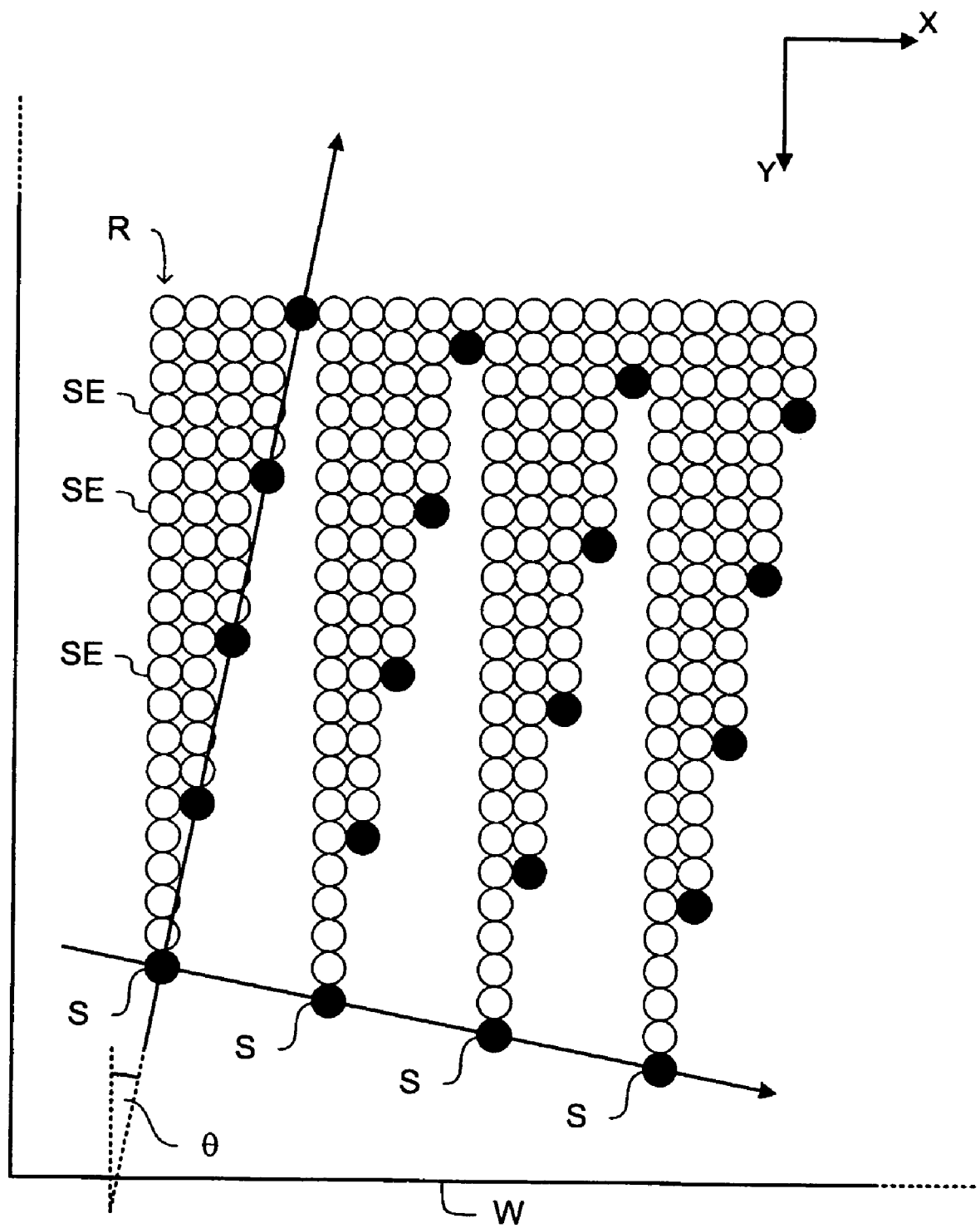
FIG. 3 depicts a mode of transferring a pattern to a substrate using an embodiment of the invention as show in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle $\theta$ is at most 20°, 10°, e.g., at most 5°, at most 3°, at most 1°, at most 0.5°, at most 0.25°, at most 0.10°, at most 0.05°, or at most 0.01°. In one example, the angle $\theta$ is at least 0.001°.

Figure 4:
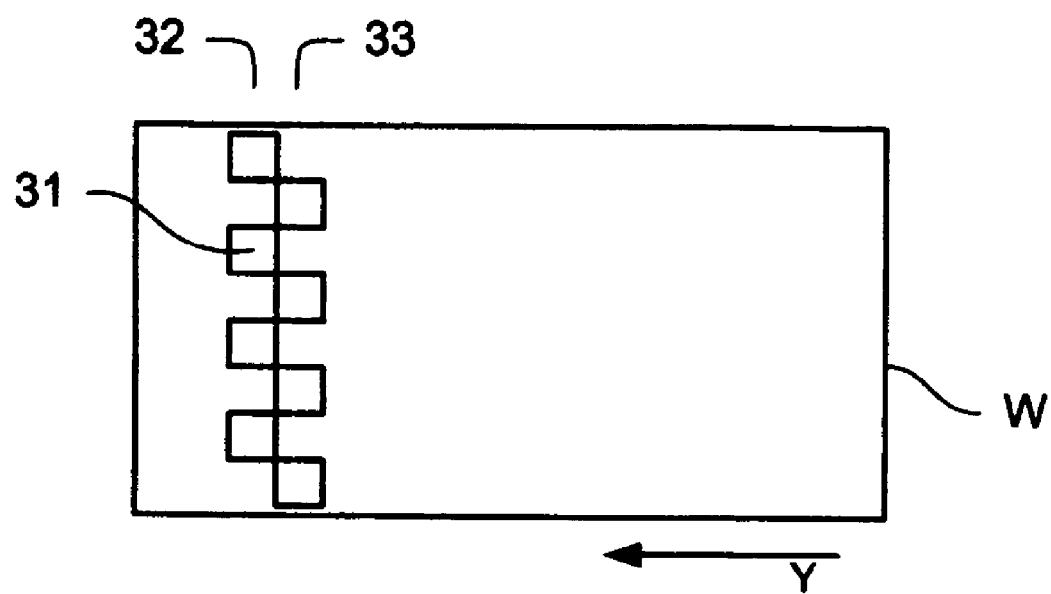
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays 31 of radiation spots S are produced by eight optical engines (not shown), arranged in two rows 32,33 in a "chess board" configuration, such that the edge of one array of radiation spots S slightly overlaps (in the scanning direction Y) with the edge of the adjacent array of radiation spots 15. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5:
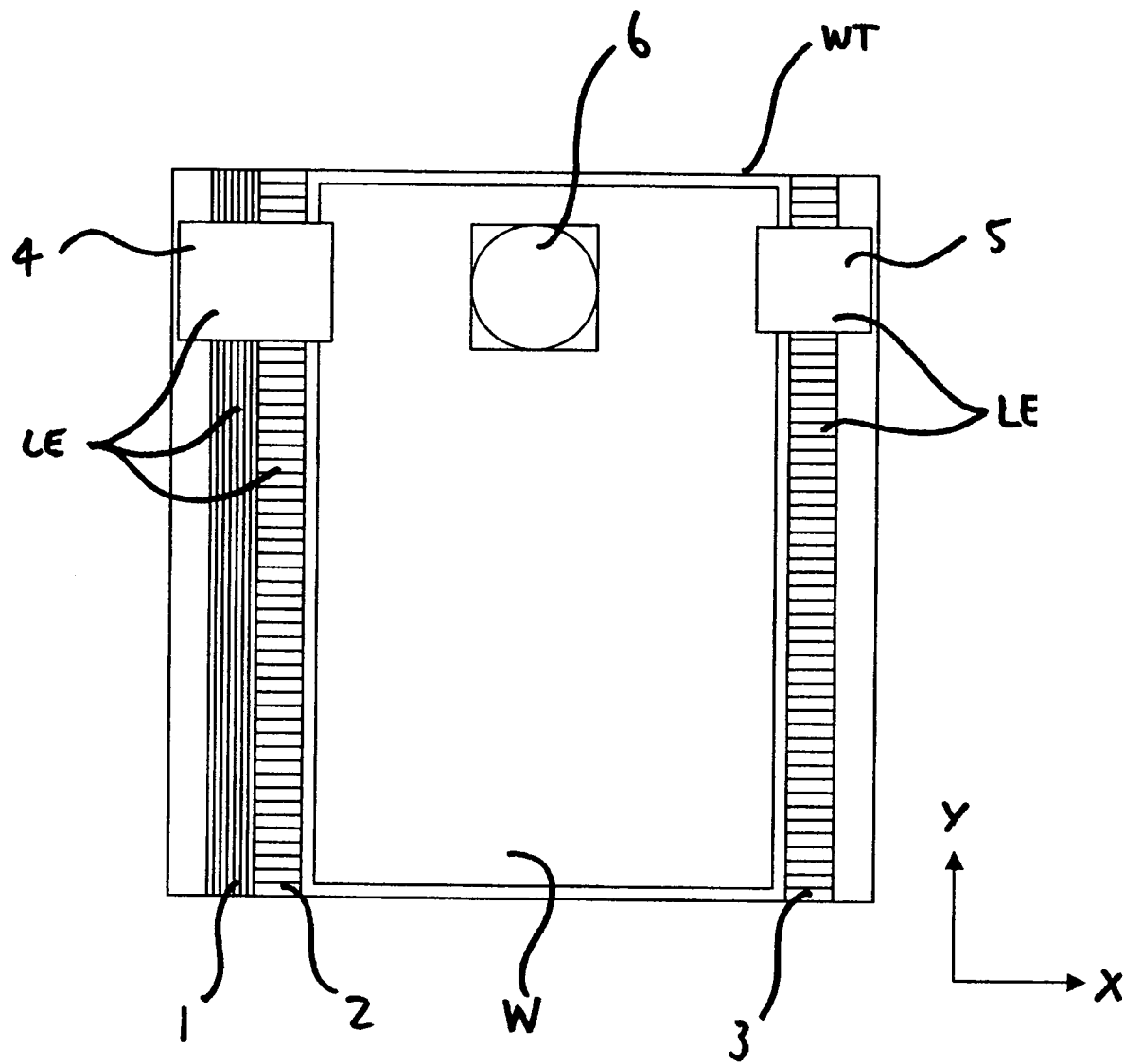
FIG. 5 depicts a lithographic apparatus according to another embodiment of the present invention.

FIG. 5 shows the substrate table WT and linear encoders LE of FIG. 1, according to one embodiment of the present invention. Located on the substrate table WT are three linear grating scales 1, 2, 3. The linear grating scales 1, 2, 3 comprise: an X linear grating scale 1 located near an edge of the substrate table WT, a first Y linear grating scale 2 located adjacent the X linear grating scale 1, and a second Y linear grating scale 3 located near an opposite edge of the substrate table WT to the first Y linear grating scale 2. The X linear grating scale 1 comprises a series of lines, which are intended to be equally spaced and parallel to the Y scanning direction. The Y linear grating scales 2, 3 comprise a series of lines that are intended to be equally spaced and perpendicular to the Y scanning direction. The use of the word "intended" in the previous two sentences is significant, and will be elaborated upon at a later stage in the description.

The lithographic apparatus also comprises linear grating sensors 4, 5, which are attached to a frame that also holds the projection system PS (the linear grating sensors 4, 5 may, in some circumstances, be directly attached to the projection system PS). For ease of illustration, the frame and the projection system PS are not shown in FIG. 5. The substrate table WT is moveable relative to the linear grating sensors 4, 5. The linear grating sensors 4,5 comprise: an X-Y linear grating sensor 4 positioned above and bridging the X linear grating scale 1 and first Y linear grating scale 2, and a Y linear grating sensor 5 positioned above the second Y linear grating scale 3. The linear grating scales 1, 2, 3 and linear grating sensors 4, 5 form linear (position) encoders LE (also shown schematically in FIGS. 1 and 2). Linear encoders are well known and are widely available from, for example, such suppliers as Heidenhain (Schaumburg, Ill., USA).

An imaging device 6 (e.g., a digital camera or other electronic image capturing device) is positioned above the substrate so that when a substrate W is in position on the substrate table WT, the imaging device 6 may form an image of the substrate W.

In one example, during operation the position of the substrate table is monitored using the linear position encoders. Accurate movement or measurement of change of position may be determined by an optical implementation of the Vernier scale, widely applied in a variety of Heidenhain detectors. The Vernier scale works on the principle that if a grating comprising lines equally spaced by a first distance is moved relative to a grating comprising lines equally spaced by a second, different distance, and the two scales are compared before and after movement, the movement can be determined to a much greater degree of accuracy than that offered by either of the two gratings independently.

As well as scanning in the Y direction, the substrate table WT is also moveable to a lesser extent in the X direction. Movement in the X direction is used to ensure that when a new substrate W is loaded for exposure it is positioned correctly for scanning in the Y direction.

When scanned in the Y direction, it is desirable that the substrate is scanned in a continuous direction (and a straight line). In one example, this is achieved by the X-Y linear grating sensor 4 tracking, or using as a guide at least one of the straight lines of the linear grating scale 1. Driving information is sent to the positioner PW, to ensure that the desired positions and tracking are physically implemented in the movement and positioning of the substrate table WT.

In one example, in order to ensure that patterns are applied to the substrate W in the correct location in the Y direction, the position encoders comprising the first Y linear grating scale 2 and X-Y linear grating sensor 4, and the second Y linear grating scale 3 and the Y linear grating sensor 5, respectively, are used to position the substrate table WT in the Y direction. Accurate positioning is achieved by applying the Vernier principle referred to above, i.e., comparing different scales of equally spaced lines. Driving information is sent to the positioner PW (shown in FIG. 1), to ensure that the desired positioning is physically implemented in the movement and positioning of the substrate table WT.

In one example, the use of linear encoders overcomes at least one of the problems associated with the use of interferometers to measure the position of the substrate table WT.

In one example, because linear grating sensors 4,5 are mounted onto the lithographic apparatus such that they are located proximate the linear grating scales 1,2,3, this substantially eliminates the effect of air fluctuations on the measured position. For example, the distance between the linear grating sensors 4, 5 and the corresponding linear grating scale may be in the range of about 0.1 mm to about 20 mm. This is in stark contrast to interferometric devices, where the path length of light may be 6 meters.

In one example, linear encoders are generally cheaper than interferometers. Due to the interferometer's high sensitivity to fluctuations in the air, stringent and therefore expensive control of the air must be adopted. However, such stringent and expensive control is not as necessary when using linear encoders, and the costs of using linear encoders is reduced accordingly.

In one example, the use of linear encoders may have some disadvantages. As described above, it is desirable that the substrate W is scanned in a continuous direction (and a straight line) in the Y direction. This requires lines of the X linear grating array 1 to be as straight as possible. However, it is known that due to manufacturing tolerances, the degree of straightness of lines of the X linear grating array 1 may not be sufficiently good for lithographic pattern application processes. Similarly, when applying patterns to the substrate W, accurate positioning in the Y direction is achieved as described above, i.e., comparing different scales of equally spaced lines. However, it is known that due to manufacturing tolerances, the lines of the Y linear grating arrays 2,3 may not be spaced equally enough for lithographic pattern application processes. These possible disadvantages, and methods of obviating or mitigating them, are described in relation to FIGS. 5, 6a, 6b, 6c, and 7a, 7b, and 7c. FIGS. 5, 6a, 6b, 6c, and 7a, 7b, and 7c are not drawn to scale, and are only schematic representations of one or more embodiments of the present invention.

Figure 6A:
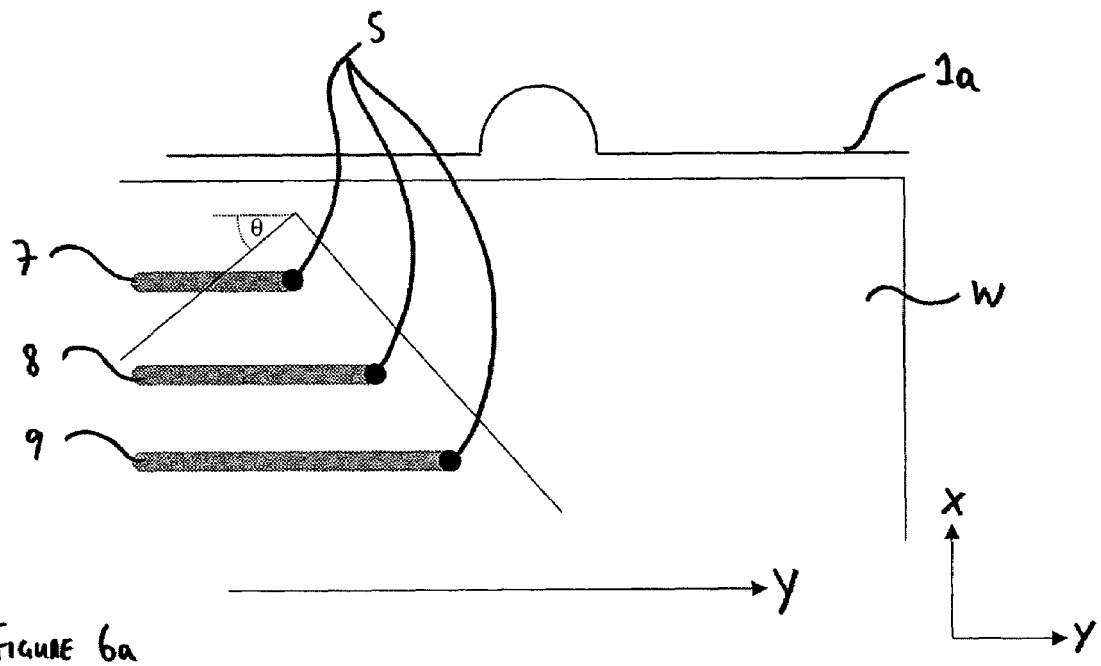
FIGS. 6a to 6c depict an operation of a lithographic apparatus, according to one embodiment of the present invention.

FIG. 6a comprises a simplified version of FIG. 3, according to one embodiment of the present invention, and shows part of an array of radiation spots S in relation to a line 1a of the X linear grating scale 1. As can be seen, the line 1a of the X linear grating scale 1 is not straight.

The lithographic apparatus is configured such that, as the substrate W is scanned in the Y direction, the array of radiation spots S continuously exposes the substrate W. Such continuous exposure produces a plurality of pattern lines 7, 8, 9 on the substrate W. As already described in relation to FIG. 3, the array of radiation spots S is arranged at an angle θ to the edges of the substrate W.

FIG. 6a shows that, when the part of the line 1a of the X linear grating scale 1 being tracked by the X-Y linear grating sensor 4 is straight, the pattern lines 7,8,9 are also straight.

Figure 6B:
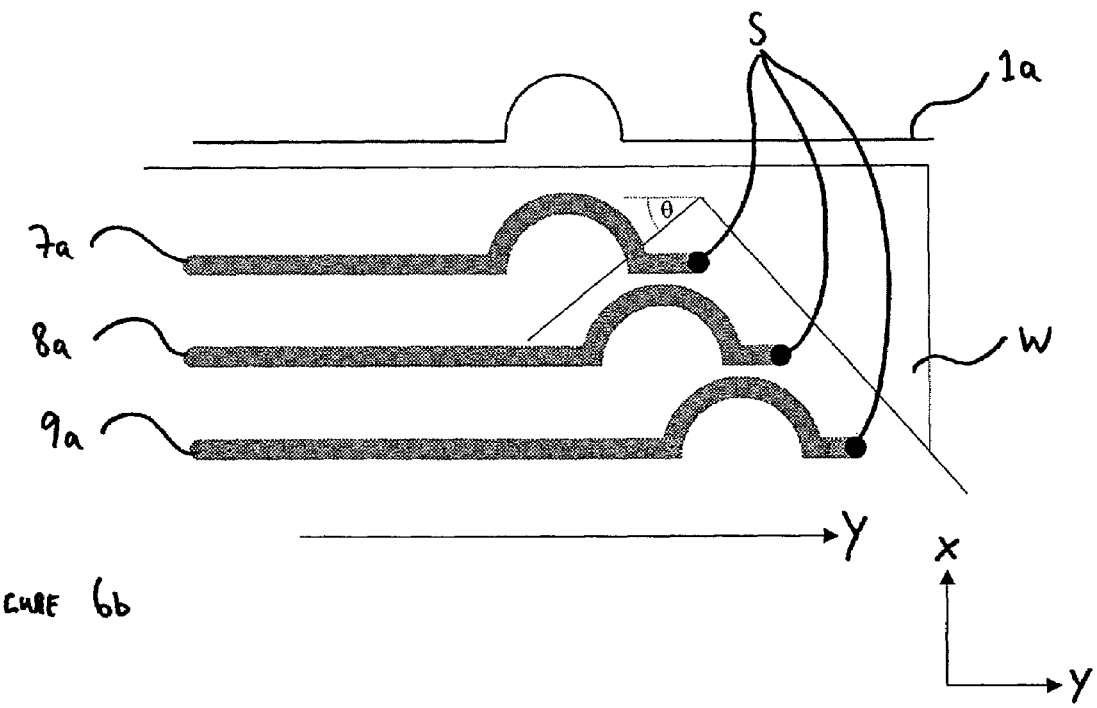

However, FIG. 6b shows that, according to one embodiment of the present invention, when the part of the line 1a of the X linear grating scale 1 being tracked by the X-Y linear grating sensor 4 is not straight, the pattern lines produced 7a, 8a, 9a are also not straight. The straightness or otherwise of the pattern lines 7a, 8a, 9a mirror the straightness or otherwise of the line 1a of the X linear grating scale 1 that is being tracked by the X-Y linear grating sensor 4.

If a straight line, or features along a straight line cannot be exposed accurately on the substrate W, this may result in unsightly defects in the optical properties of a flat panel display in which the substrate is ultimately used.

Figure 6C:
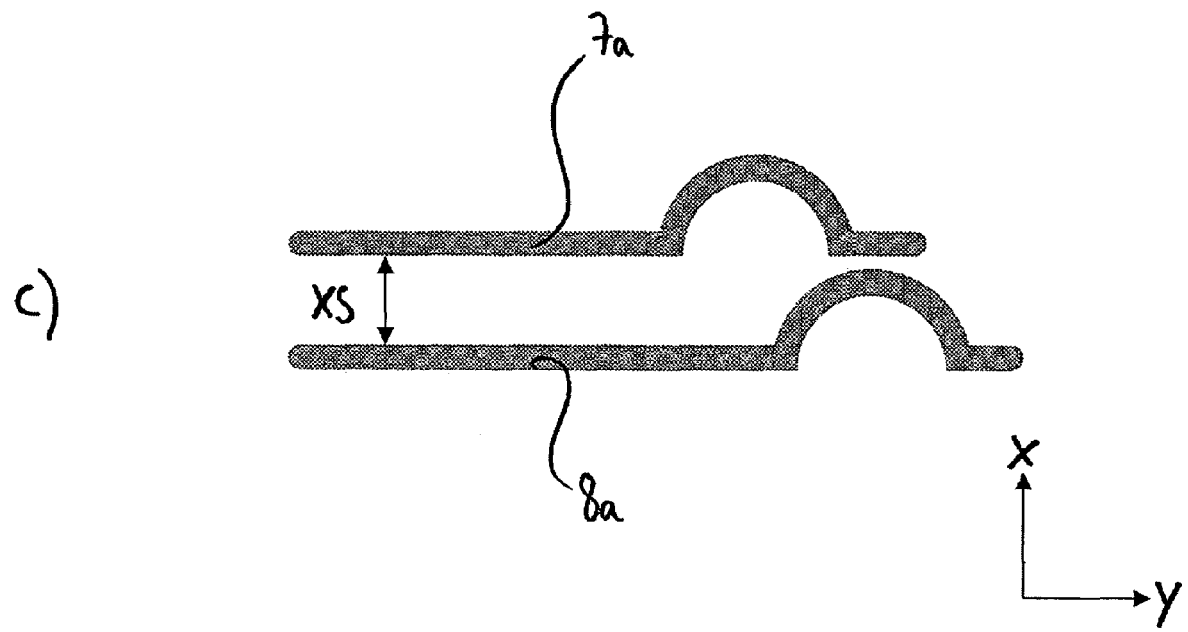

In one example, in order to ensure that the pattern lines 7a, 8a, 9a are straight, there is a need to, for example, apply a corrective measure to the positioner PW (as shown, for example, in FIG. 1), such that the pattern lines 7a, 8a, 9a are straight regardless of the any non-uniformity (or lack of straightness) of the of lines (e.g., line 1a) of the X linear grating scale 1. Although desirable, there is no structure on the lithographic apparatus which can be guaranteed as being as straight as is required, which could be used as a reference against which the lines of the X linear grating could be compared. In one example, such a straight structure is not required. As illustrated in FIG. 6c, adjacent pattern lines 7a, 8a may act as the required references.

Referring back to FIG. 5, the imaging device 6 takes an image of the pattern lines 7a, 8a. FIG. 6c shows the two adjacent pattern lines 7a, 8a imaged by the imaging device 6, according to one embodiment of the present invention.

It can be seen that since the array of radiation spots S is arranged at an angle θ to the edges of the substrate W, the pattern lines 7a, 8a are offset relative to one another in the Y direction. As a consequence of this offset, any non-linearity in the line 1a of the X linear grating array 1 will be reflected in each of the pattern lines 7a, 8a, but at different locations in the Y direction for each pattern line 7a, 8a. In one example, this offset can be taken advantage of, and by comparing the separation of the adjacent pattern lines 7a, 8a in the X direction, the degree of straightness of the line 1a of the X linear grating array 1 can be determined.

In one example, after the imaging device 6 has obtained an image of the pattern lines 7a, 8a, a computer program processes the image. The separation in the X direction XS between the adjacent pattern lines 7a, 8a is measured at points along the Y direction. For example, the separation in the X direction XS between the adjacent pattern lines 7a, 8a may be measured at about 0.1 mm, about 1 mm or about 5 mm intervals in the Y direction. The measurement interval may be appropriate to a required resolution in the determination of the degree non-uniformity in the line 1a. From these measured separations, a profile of the separation of the adjacent lines is established. This profile can be analyzed to reveal the degree of straightness of the line 1a of the X linear grating array 1. For example, if the separation XS is constant for all values of Y, then the line 1a of the X linear grating array 1 is straight. If the separation suddenly increases from 1 μm to an increased but constant value of 1.5 μm, then there is a step of 0.5 μm in the line 1a of the X linear grating array 1. In practice, the variation may be much more subtle, and the analysis more complex, but the principle of operation is the same.

When the degree of straightness of the line 1a of the X linear grating array 1 is known, this information can be used to apply a corrective measure to the positioner PW, such that future pattern lines exposed by the array of radiation spots S are straight, regardless of the straightness of lines of the X linear grating scale 1.

Figure 7A:
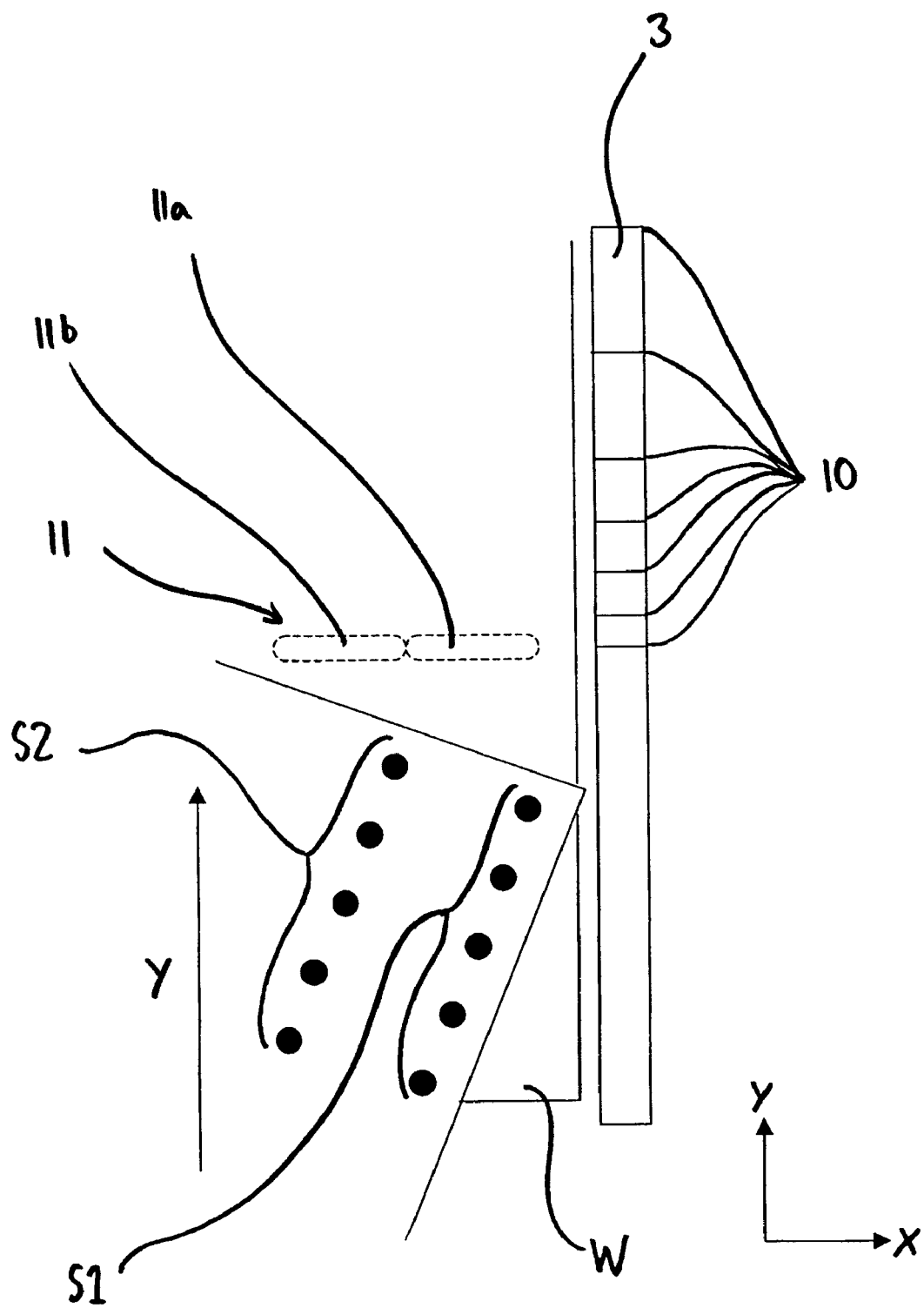
FIGS. 7a to 7c depict another operation of a lithographic apparatus, according to one embodiment of the present invention.

FIG. 7a comprises a simplified version of FIG. 3, according to one embodiment of the present invention, and shows part of an array of radiation spots S, and lines 10 of the second Y linear grating scale 3. As can be seen, the lines 10 of the second Y linear grating scale 3 are not equally spaced. As already described in relation to FIG. 3, the array of radiation spots S is arranged at an angle to the edges of the substrate W.

FIG. 7a shows, using broken-lines, an intended pattern line 11 that is to be exposed on the substrate W. The broken lines do not appear on the substrate W, or on/in any images of the substrate, and are included in FIGS. 7a-7c for explanatory purposed only. The intended pattern line 11 is perpendicular to the Y scanning direction, i.e., the line is parallel to the X direction. A first part 11a of the intended pattern line 11 is to be exposed by a first column of radiation spots S1 of the array of radiation spots S as the substrate is scanned in the Y direction. Similarly, a second part 11b of the intended pattern line 11 is to be exposed by a second column of radiation spots S2 of the array of radiation spots S as the substrate is scanned in the Y direction.

In one example, accurate application of the first and second parts 11a, 11b of the intended pattern 11 to the substrate W is dependent on the substrate W being moved to the correct position for exposure, and the array of radiation spots exposing the substrate for the correct period of time. Taking the first part 11a of the intended pattern line 11 as an example, the substrate W is scanned in the Y direction. At the same time, and without the scanning being interrupted, when in the intended position, a radiation spot of the first column S1 exposes a part of the first part 11a of the intended pattern line 11 and then stops exposing. The scanning of the substrate continues, and an adjacent spot in the first column S1 exposes an adjacent part of the first part 11a of the intended pattern line 11 and then stops exposing. This process continues until the (now exposed) first part 11a of the intended pattern 11 has been scanned past all of the radiation spots in the first column of radiation spots S1. At this point, the first part 11a of the intended pattern line 11 has been exposed. It will be appreciated that, at the same time, the second part 11b of the intended pattern line is being exposed by the second column of radiation spots S2.

In one example, correct timing of the exposures is achieved by monitoring how far the substrate W has been scanned before instructing another (e.g. adjacent) spot to expose the substrate. For example, if each exposure from an adjacent radiation spot in the first column S1 is to form a line in the X direction, the substrate has to be scanned in the Y direction by a distance equal to the separation of the radiation spots in the Y direction, for each adjacent spot exposure. Ideally, ensuring that the substrate W is in the correct position during exposure is achieved by the Y linear grating sensor monitoring, or "tracking" the (supposedly) equally spaced lines making up the second Y encoder grating 3, and feeding this information to the positioner PW (shown, for example, in FIG. 1).

Figure 7B:
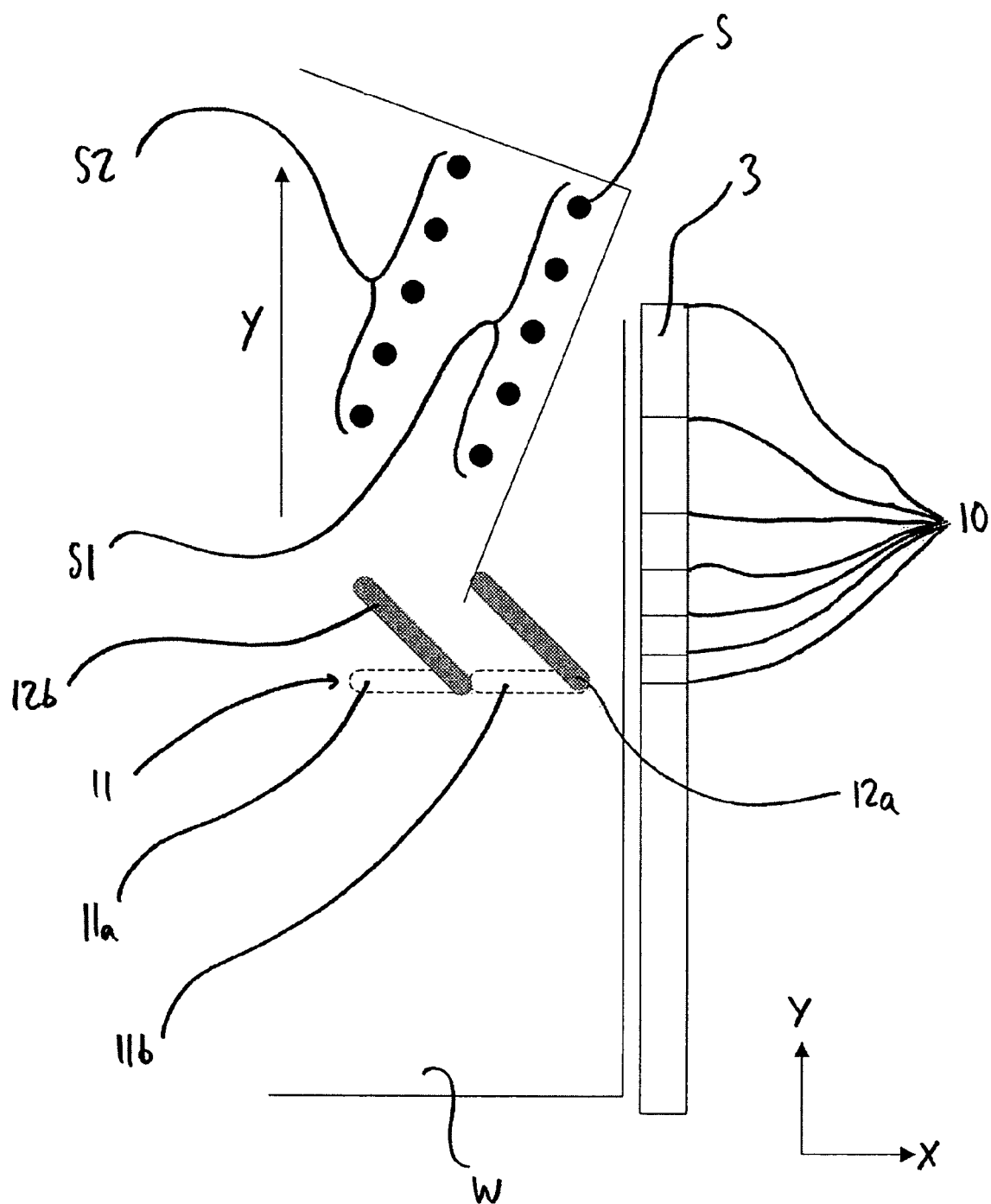

FIG. 7b shows, using broken-lines, an intended pattern line 11 that was to be exposed on the substrate W, together with lines that were actually exposed 12a, 12b, according to one embodiment of the present invention. It can be seen that the intended 11a, 11b and actual lines 12a, 12b do not correspond with each other. As the lines 10 of the second Y linear grating scale 3 are not equally spaced, the above mentioned requirement of scanning the substrate W by an equal amount for each exposure by a subsequent (or adjacent) radiation spot does not happen.

FIGS. 7a and 7b show that the separation between the lines 10 of the second Y linear grating scale 3 increases with each line 10 in the Y scanning direction. As a consequence of this increasing separation, the Y linear grating sensor 5, which tracks the lines 10 of the second Y linear grating scale, causes the radiation spots to expose the substrate W at increasing distances in the Y direction. This results in the exposed lines 12a, 12b on the substrate W diverging from those intended 11a, 11b.

It can be seen that as each column S1, S2 of radiation spots exposes a part of the line 12a, 12b, the error, or separation from the intended line 11, will repeat over a distance equal to the "footprint" of the radiation spots of each column S1, S2.

If a straight line, or at least features along a straight line cannot be accurately exposed on the substrate W, this may result in unsightly defects in the optical properties of a flat panel display in which the substrate is ultimately used.

In order to ensure that the actual exposed lines 12a, 12b correspond to those intended 11a, 11b, there is a need to, for example, apply a corrective measure to the positioner PW, such that the exposed lines 12a, 12b correspond to those intended 11a, 11b regardless of the spacing between lines 10 constituting the second Y linear grating scale 3. Although desirable, there is no structure on the lithographic apparatus which can be guaranteed as having equally spaced lines, which could be used as a reference against which the lines 10 of the second Y linear grating 3 could be compared. However, in one example, comparison with a structure having equally spaced lines is not required. The determination of the degree of non-uniformity of the spacing of the lines constituting the second Y linear grating scale 3 can be made by looking at patterns exposed on the substrate W.

Figure 7C:
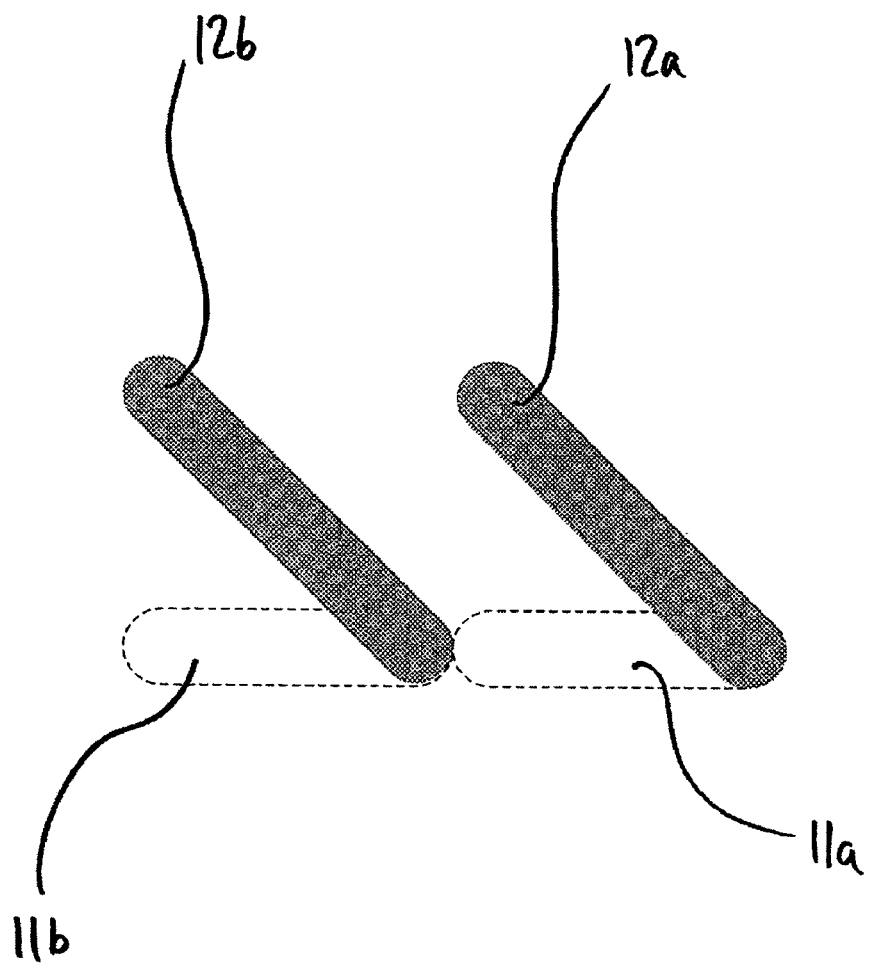

The imaging device shown in FIG. 5 takes an image of the exposed lines 12a, 12b of FIG. 7b. FIG. 7c shows the exposed lines 12a, 12b as imaged by the imaging device, according to one embodiment of the present invention.

As described above, the exposed lines 12a, 12b diverge from the intended lines 11a, 11b, corresponding to each spot of the column being exposed at positions in the Y direction at ever increasing separation from those intended. In one example, the profile of the separation of lines 10 constituting the second Y linear grating scale 3 determines the shape (or profile) and position of the exposed line 12a, 12b. Conversely, in this example the separation of the lines 10 constituting the second Y linear grating scale 3 can be inferred from measurements of the exposed line 12a, 12b. By analyzing the exposure pattern (i.e., the exposed lines 12a, 12b), the degree of separation of the lines 10 can be extracted from the pattern.

In one example, after the imaging device 6 has obtained an image of the exposed lines 12a, 12b, a computer program processes the image. In processing the image, the computer program compares the positions of the exposures of adjacent radiation spots of the array S, and also compares the shape and position of the actual exposures with the intended shape and positions. Using these comparisons, the program analyses the image to determine the non-uniformity of the lines 10 constituting the second Y linear array scale 3, and also any corrective measures that may need to be applied to the positioner PW.

In one example, the analysis can be a simple process. For example, when the intended line 11 is a straight line in the X direction, and the comparison of adjacent radiation spot exposures reveals that the exposed line 12a, 12b is also a straight line in the X direction, the exposed pattern is of the correct shape. When the intended line 11 located at a specific Y position, and the comparison of radiation spot exposures S with corresponding intended exposures reveals that the exposed line 12a, 12b is also in that specific Y position, the exposed pattern is in the correct position. If the shape and position of the exposed line 12a, 12b corresponds to the intended line 11, then the lines 10 constituting the second Y linear grating scale 3 in the vicinity of the exposed line 12a, 12b are equally spaced. In other words, the second Y linear grating scale 3 does not include any non-uniformities in the vicinity of the exposed line 12a, 12b.

In another example, the intended line 11 is a straight line in the X direction, and the comparison of adjacent radiation spot exposures reveals that the exposed line 12a, 12b comprises two straight lines in the X direction, but offset from each other and forming a "step" in the Y direction. This indicates that the lines 10 constituting the second Y linear grating scale 3 in the vicinity of the exposed line 12a, 12b are not equally spaced, but instead include a non-uniformity (i.e., a discontinuity, or "step").

In yet another example, a line intended to be straight in the X direction may actually be exposed as a curve, for example having a sine wave characteristic. This indicates that the variation in the separation of lines 10 constituting the second Y linear grating scale 3 also has a sine wave characteristic.

In general, the shape and position of the non-uniformity of the exposed pattern corresponds to the shape and position of the non-uniformity in the linear grating scale 3.

In reality, the variation in the separation of lines 10 constituting the second Y linear grating scale 3 may be much more subtle than described in the above-mentioned scenarios, and the analysis more complex, but the principle of operation and image processing is the same.

When the separations of the lines 10 constituting the second Y linear grating scale (or at least an indications thereof) are known, this information can be used to apply a corrective measure to the positioner PW. The corrective measure comprises compensating for the non-uniformity in the second Y linear grating scale 3 in the positioning of the substrate W, so that future pattern lines exposed by the array of radiation spots S are in the correct, or intended Y position, regardless of the uniformity of the separation of lines 10 constituting the second Y linear grating scale 3.

It will be appreciated that the same principles of analysis apply to the determination of and/or compensating for the degree of separation of lines in the first Y linear grating scale 1. The embodiment is described with reference to the second Y linear grating scale 3 and Y linear grating sensor 5 as an example only.

It is to be appreciated that each of the Y linear grating scales 2, 3 may have different non-uniformities. The different non-uniformities of each Y linear grating scale 2, 3 will introduce different non-uniformities in the exposed pattern lines. The non-uniformities of each Y linear grating scale 2, 3 will introduce non-uniformities predominantly in patterns exposed by arrays of radiation spots S adjacent the linear grating scale 2, 3 in question. Non-uniformities in the exposed pattern across the width of the substrate W are compensated for by correcting for non-uniformities adjacent to and introduced by each of the Y grating scales 2, 3.

In one example, the non-uniformity (i.e., straightness of lines in the X grating scale 1, separation of lines in the Y grating scales) of the linear grating scales 1,2,3 can be determined from taking an image of the pattern applied to the substrate W, and then processing that image. When any non-linearity has been determined, it can be stored, and then compensated for in future pattern exposures.

It will be appreciated that corrective measures may be applied to the patterning device PD to compensate for non-uniformities in the linear grating scales 1, 2, 3. For example, corrective measures may be applied to the array of individually controllable elements, which deliberately introduce non-uniformities into the pattern which compensate for non-uniformities in the linear grating scales 1, 2, 3. Thus, as opposed to controlling the position of the substrate W, application of the pattern may be controlled to compensate for the non-uniformities in the linear grating scales 1, 2, 3.

It will be appreciated that determination of the non-uniformity of the linear grating scales 1,2,3 may be made from a preset "test pattern." For example, the test pattern may comprise an array of lines, intended to be parallel to the Y and X directions (e.g. a grid of lines). The deviation from this intended linear array may then be used to determine the corrective measures required for future exposures.

It will be appreciated that the use of a computer to analyze (or more generally, determine the non-uniformity of the linear grating scales 1, 2, 3 from) the images is not essential. Other image processing units may suffice. For example, the images may be analyzed by an embedded processor. The image processing unit may be a standalone piece of apparatus. The image processing unit may be a standalone computer program or algorithm, or one that is integrated into a multi-functional computer program or algorithm.

Although the embodiments of the present invention have been described with reference to exposure, or pattern lines, it will be appreciated that other exposures may suffice. For example, an array of spots arranged in a line may suffice. The array may be closely or sparsely populated. Specifically, the use of the term "line" does not imply that the line is continuous. The line can be discontinuous. All that is required is a pattern that can be spatially compared with another (which may be an exposed or intended pattern, as described in the embodiments above).

It will be appreciated that the imaging device 6 need not image the entire substrate, and all patterns thereon. The imaging device 6 may image a plurality of patterns. The imaging device may image part of a pattern or patterns.

Embodiments of the present invention have been described with reference to the use of linear encoders. However, it will be appreciated that any suitable position encoder may be used.

Embodiments of the present invention have been described with reference to the use of a plurality of linear grating scales. It will be appreciated that, where appropriate, linear grating scales may be replaced with a two-dimensional grid. For example, the X linear grating scale 1 and first Y linear grating scale 2 of FIG. 5 can be combined to form a single two-dimensional grid. The spacing of lines within the two-dimensional grid in the X direction will correspond to spacing of lines within the X linear grating scale 1, and the spacing of lines within the two-dimensional grid in the Y direction will correspond to spacing of lines within the first Y linear grating scale 2. As with the reading of the lines of the linear grating scales, a first grid sensor will read the grid lines in the X direction, and a second grid sensor will read the grid lines in the Y direction. The sensors may be combined to form a single unit.

As described in the embodiments above, accurate movement or measurement of change of position the substrate table may be determined by an optical implementation of the Vernier scale. Alternatively, interferometric principles may be used to determine the position of the substrate table. Interferometric principles may allow the position of the substrate table to be determined to a higher degree of accuracy. Such interferometric principles are well known in the art and are commonly used in Heidenhain detectors, and will therefore not be discussed in more detail here.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g., a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:
1. A lithographic apparatus, comprising:
an illumination system that conditions a radiation beam;
an array of individually controllable elements that modulate the radiation beam;
a substrate table that supports a substrate;
a projection system that projects the modulated radiation beam onto a target portion of the substrate, thereby applying a pattern to the target portion of the substrate, the pattern comprising a first line and a second line, the first line being offset from the second line;
a position encoder that determines a position of the substrate table, the position encoder comprising a position sensor and a scale, the scale comprising a plurality of lines intended to be straight and parallel to one another;
an imaging device that obtains an image of the first line and the second line; and
an image processing unit that measures separation between the first line and the second line in a plurality of locations thereby defining a plurality of separations and determines a non-uniformity of at least a part of the scale from the plurality of separations.

2. The lithographic apparatus of claim 1, wherein the image processing unit establishes a profile of the separation between the first line and the second line.

3. The lithographic apparatus of claim 2, wherein the image processing unit analyzes the profile and determines from the analysis a corrective measure that will make the separation between the first line and the second line substantially constant in subsequent patterning.

4. The lithographic apparatus of claim 3, wherein the corrective measure comprises introducing a non-uniformity into the array of individually controllable elements that compensates for the non-uniformity of the scale.

5. The lithographic apparatus of claim 3, wherein the corrective measure comprises controlling a position of a positioner that positions the substrate to compensate for the non-uniformity of the scale.

6. The lithographic apparatus of claim 1, wherein at least one of the first line and second line are part of a longer line.

7. The lithographic apparatus of claim 1, further comprising a storage medium that stores the non-uniformity of at least a part of the scale.

8. A lithographic apparatus, comprising:
an illumination system that conditions a radiation beam;
an array of individually controllable elements that modulate the radiation beam according to an intended pattern;
a substrate table that supports a substrate;
a projection system that projects the modulated radiation beam onto a target portion of the substrate;
a position encoder that determines a position of the substrate table, the position encoder comprising a position sensor and a scale, the scale comprising a plurality of lines intended to be equally spaced;
an imaging device that obtains an image of at least a part of a pattern exposed on the substrate; and
an image processing unit that compares the exposed pattern with at least a part of the intended pattern and determines a non-uniformity of at least a part of the scale from the comparison.

9. The lithographic apparatus of claim 8, wherein the comparison comprises comparing a position of a part of the exposed pattern with a position of a part of the intended pattern.

10. The lithographic apparatus of claim 8, wherein the comparison further comprises comparing a position of a part of the exposed pattern with a position of an adjacent part of the exposed pattern.

11. The lithographic apparatus of claim 8, wherein the image processing unit analyzes the comparison and determines from the analysis a corrective measure that will make the exposed pattern correspond to the intended pattern in subsequent pattern applications.

12. The lithographic apparatus of claim 11, wherein the corrective measure comprises introducing a non-uniformity into the array of individually controllable elements that compensates for the non-uniformity of the scale.

13. The lithographic apparatus of claim 11, wherein the corrective measure comprises controlling a position of a positioner that positions the substrate to compensate for the non-uniformity of the scale.

14. The lithographic apparatus of claim 8, further comprising a storage medium that stores the non-uniformity of at least a part of the scale.

15. A method of determining a non-uniformity of lithographic apparatus, comprising:
projecting a modulated radiation beam onto a target portion of a substrate, thereby applying a pattern to the target portion of a substrate, the pattern comprising a first line and a second line, the first line being offset from the second line;
determining a position of a substrate table supporting the substrate using a position encoder, the position encoder comprising a position sensor and a scale, the scale comprising a plurality of lines intended to be equally spaced;
using an imaging device to obtain an image of the first line and the second line;
measuring a separation between the first line and the second line in a plurality of locations; and
determining the non-uniformity of at least a part of the scale from the plurality of separations.

16. The method of claim 15, further comprising establishing a profile of the separation between the first line and the second line.

17. The method of claim 16, further comprising:
analyzing the profile; and
determining from the analysis a corrective measure that will make the separation between the first line and the second line substantially constant in subsequent pattern applications.

18. The method of claim 17, wherein the corrective measure comprises introducing a non-uniformity into an array of individually controllable elements, which are used to generate the modulated radiation beam, which compensates for the non-uniformity of the scale.

19. The method of claim 17, wherein the corrective measure comprises controlling a position of a positioner that positions the substrate to compensate for the non-uniformity of the scale.

20. A flat panel display manufactured according to the method of claim 15.

21. A method of determining a non-uniformity of lithographic apparatus, comprising:
projecting a modulated radiation beam onto a target portion of a substrate, thereby applying an exposed pattern to the target portion of substrate;
determining a position of a substrate table supporting the substrate using a position encoder, the position encoder comprising a position sensor and a scale, the scale comprising a plurality of lines intended to be equally spaced;
using an imaging device to obtain an image of at least part of the pattern;
comparing the pattern with a corresponding intended pattern; and
determining a non-uniformity of at least a part the of scale from the comparison.

22. The method of claim 21, wherein the comparing step comprises comparing a position of a part of the exposed pattern with a position of a part of the corresponding intended pattern.

23. The method of claim 21, wherein the comparing step further comprises comparing a position of a part of the exposed pattern with a position of an adjacent part of the exposed pattern.

24. The method of claim 21, further comprising:
analyzing the comparison; and
determining from the analyzing step a corrective measure that will make the exposed pattern correspond to the intended pattern in subsequent pattern applications.

25. The method of claim 24, wherein the corrective measure comprises introducing a non-uniformity into an array of individually controllable elements, which are used to produce the modulated radiation beam, which compensates for the non-uniformity of the scale.

26. The method of claim 24, wherein the corrective measure comprises controlling a position of a positioner that positions the substrate to compensate for the non-uniformity of the scale.

27. A flat panel display manufactured according to the method of claim 22.

28. A lithographic apparatus, comprising:
an illumination source that conditions a radiation beam;
an array of individually controllable elements that modulate the radiation beam;
a substrate table having a first grating and that supports a substrate;

a projection system that projects the modulated radiation beam onto a target portion of the substrate;

a positioner that positions the substrate table; and a position encoder having a second grating and arranged to determine a position of the substrate table by comparing a position of the first grating with a position of the second grating.

* * * * *

UNITED STATES PATENT AND TRADEMARK OFFICE
CERTIFICATE OF CORRECTION

PATENT NO. : 7,408,617 B2  Page 1 of 1
APPLICATION NO. : 11/165575
DATED : August 5, 2008
INVENTOR(S) : Van Der Pasch et al.

It is certified that error appears in the above-identified patent and that said Letters Patent is hereby corrected as shown below:

Title Page
Item (54), please replace "ENCODERS AN ENCODER SCALE" with --ENCODERS AND ENCODER SCALE--.

Column 1
Line 4, please replace "ENCODERS AN ENCODER SCALE" with --ENCODERS AND ENCODER SCALE--.

Signed and Sealed this

Thirtieth Day of September, 2008

JON W. DUDAS
*Director of the United States Patent and Trademark Office*